United States Patent
Shirai et al.

(10) Patent No.: US 10,363,585 B2
(45) Date of Patent: Jul. 30, 2019

(54) CLEANING SOLUTION, METHOD OF REMOVING A REMOVAL TARGET AND METHOD OF ETCHING A SUBSTRATE USING SAID CLEANING SOLUTION

(71) Applicant: TOKYO OHKA KOGYO CO., LTD., Kawasaki-shi (JP)

(72) Inventors: Yuriko Shirai, Kawasaki (JP); Ryusuke Uchida, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/495,092

(22) Filed: Apr. 24, 2017

(65) Prior Publication Data

US 2017/0309468 A1    Oct. 26, 2017

Related U.S. Application Data

(60) Provisional application No. 62/327,694, filed on Apr. 26, 2016.

(51) Int. Cl.
| | |
|---|---|
| B08B 3/08 | (2006.01) |
| H01L 21/02 | (2006.01) |
| C11D 7/50 | (2006.01) |
| C11D 7/32 | (2006.01) |
| C11D 11/00 | (2006.01) |
| H01L 21/3065 | (2006.01) |
| G03F 7/42 | (2006.01) |
| C11D 7/26 | (2006.01) |
| B08B 3/00 | (2006.01) |
| B08B 3/04 | (2006.01) |
| H01L 21/311 | (2006.01) |

(52) U.S. Cl.
CPC .......... *B08B 3/08* (2013.01); *B08B 3/00* (2013.01); *B08B 3/04* (2013.01); *C11D 7/263* (2013.01); *C11D 7/3209* (2013.01); *C11D 7/50* (2013.01); *C11D 7/5022* (2013.01); *C11D 11/0047* (2013.01); *G03F 7/425* (2013.01); *H01L 21/0206* (2013.01); *H01L 21/02057* (2013.01); *H01L 21/30655* (2013.01); *H01L 21/31133* (2013.01)

(58) Field of Classification Search
None
See application file for complete search history.

(56) References Cited

U.S. PATENT DOCUMENTS

2013/0330927 A1* 12/2013 Kumagai ............... G03F 7/425
                                                            438/675

FOREIGN PATENT DOCUMENTS

JP          2015-030695          2/2015

\* cited by examiner

*Primary Examiner* — Jiong-Ping Lu
(74) *Attorney, Agent, or Firm* — Knobbe, Martens, Olson & Bear LLP

(57) ABSTRACT

A cleaning liquid which includes 3-alkoxy-3-methyl-1-butanol represented by the following general formula (1); at least one of diethylene glycol monomethyl ether and triethylene glycol monomethyl ether; and quaternary ammonium hydroxide:

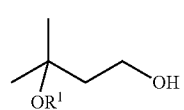

(1)

in which $R^1$ represents an alkyl group having 1 to 5 carbon atoms.

9 Claims, 2 Drawing Sheets

CLEANING SOLUTION, METHOD OF REMOVING A REMOVAL TARGET AND METHOD OF ETCHING A SUBSTRATE USING SAID CLEANING SOLUTION

CROSS-REFERENCE TO RELATED APPLICATIONS

Priority is claimed on U.S. Provisional Application Ser. No. 62/327,694, filed Apr. 26, 2016, the content of which is incorporated herein by reference.

BACKGROUND OF THE INVENTION

Field of the Invention

The present invention relates to a cleaning liquid which is suitably used in a method of etching a substrate by a BOSCH method, a method of removing a target to be removed through a semiconductor manufacturing process in which the cleaning liquid is used, and a method of etching a substrate in which the cleaning liquid is used.

Background Art

For example, in a processing process of micro electro mechanical systems (MEMS), or a processing process of a silicon through electrode (TSV, through-silicon via), there is a need to deeply dig a substrate such as a silicon substrate through etching in some cases. In such a case, the etching process called a BOSCH method is employed in many cases, since an etching rate and an aspect ratio of a hole formed through the etching are easily controlled.

The BOSCH method is a method of slowly digging a silicon substrate while forming a fluorocarbon layer on an inner surface of a portion which is dug down through the etching by fluorocarbon gas. For this reason, the fluorocarbon layer is deposited and adheres on the inner surface of the hole formed on the silicon substrate, thus making the fluorocarbon layer hard to be peeled off. Accordingly, in the case where the hole is formed on the silicon substrate by the BOSCH method, there is a need to finally remove the fluorocarbon layer which is deposited and adheres on the inner surface of the hole while being hard to be peeled off.

Further, a cleaning liquid with which not only a fluorocarbon layer, but also a resist film (particularly, a crosslinking type negative resist film) formed in the semiconductor manufacturing process can be removed has been required.

In addition, the cleaning liquid requires excellent storage stability, which means that phase separation does not occur during the storage.

As the cleaning liquid which is excellent in dissolving power with respect to a polymethyl methacrylate (PMMA) resin or the like, a mixed solvent containing 3-alkoxy-3-methyl-1-butanol is known (refer to Japanese Unexamined Patent Application, Publication No. 2015-30695).

SUMMARY OF THE INVENTION

The present invention is made in view of the problems, and an object thereof is to provide a cleaning liquid with which a resist film can be removed, and phase separation does not occur. In addition, there are provided a method of removing a target to be removed, which is formed in a semiconductor manufacturing step, with the cleaning liquid, and a method of etching a substrate by a BOSCH method using the cleaning liquid.

The present inventors have completed the present invention by finding out that when 3-alkoxy-3-methyl-1-butanol, a specific monomethyl ether compound, and a quaternary ammonium hydroxide are mixed in a cleaning liquid, the above-described problems can be solved. Specifically, the present invention provides the following.

According to a first aspect of the present invention, a cleaning liquid includes (A1) 3-alkoxy-3-methyl-1-butanol represented by the following general formula (1), (A2) at least one monomethyl ether compound selected from the group consisting of diethylene glycol monomethyl ether and triethylene glycol monomethyl ether, and (B) quaternary ammonium hydroxide:

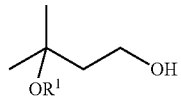

(1)

wherein $R^1$ represents an alkyl group having 1 to 5 carbon atoms.

According to a second aspect of the present invention, there is provided a method of removing at least one target to be removed selected from the group consisting of a resist pattern, a fluorocarbon layer, and a polyimide layer, the removing method including a step of removing the target to be removed with the cleaning liquid of the first aspect, in which the target to be removed is formed in a semiconductor manufacturing step.

According to a third aspect of the present invention, there is provided a method of etching a substrate including (A-I) an etching mask pattern forming step of forming an etching mask pattern on a surface of a substrate, (A-II) a first etching step of etching the surface of the substrate exposed through the etching mask pattern to form a recessed portion, (A-III) a recessed portion forming step of forming a recessed portion having a predetermined depth on a substrate by repeatedly performing the following steps (i) and (ii) until a recessed portion having the predetermined depth is formed, [(i) a fluorocarbon layer forming step of forming a fluorocarbon layer on a side wall of the recessed portion of the surface of the substrate, which is formed by etching, and (ii) a second etching step of etching a bottom face of the recessed portion], and (A-IV) a fluorocarbon layer removing step of removing the fluorocarbon layer with the cleaning liquid after forming the recessed portion having the predetermined depth, in which in the fluorocarbon layer removing step, as the cleaning liquid, the cleaning liquid according to the first aspect is used.

According to a fourth aspect of the present invention, there is provided a method of etching a substrate including (C-I) an etching mask layer forming step of forming an etching mask layer on the surface of the substrate, (C-II) a resist film forming step of forming a resist film by applying a resist composition onto the etching mask layer, (C-III) a resist pattern forming step of exposing and developing the resist film, (C-IV) an etching mask pattern forming step of etching the etching mask layer exposed through an opening portion of the resist pattern to form an etching mask pattern, and then removing the resist pattern with a cleaning liquid, (C-V) a first etching step of etching the surface of the substrate exposed through the etching mask pattern to form a recessed portion, (C-VI) a recessed portion forming step of forming a recessed portion having a predetermined depth on a substrate by repeatedly performing the following steps (i)

and (ii) until a recessed portion having the predetermined depth is formed, [(i) a fluorocarbon layer forming step of forming a fluorocarbon layer on a side wall of a recessed portion of the surface of the substrate, which is formed by etching, and (ii) a second etching step of etching a bottom face of the recessed portion], and (C-VII) a fluorocarbon layer removing step of removing the fluorocarbon layer with the cleaning liquid after forming the recessed portion having the predetermined depth, in which in the etching mask pattern forming step and/or the fluorocarbon layer removing step, as the cleaning liquid, the cleaning liquid according to the first aspect is used.

Regarding the cleaning liquid of the present invention, the resist film or the like can be removed and the phase separation does not occur. In addition, the fluorocarbon layer and the polyimide film can be removed with the cleaning liquid of the present invention. Further, in the removing method of the present invention, the target to be removed which is formed in the semiconductor manufacturing step can be removed with the cleaning liquid.

In addition, according to the present invention, it is possible to provide the method of etching a substrate with the aforementioned cleaning liquid through the BOSCH method.

DETAILED DESCRIPTION OF THE INVENTION

Cleaning Liquid According to First Aspect

Figure 1:
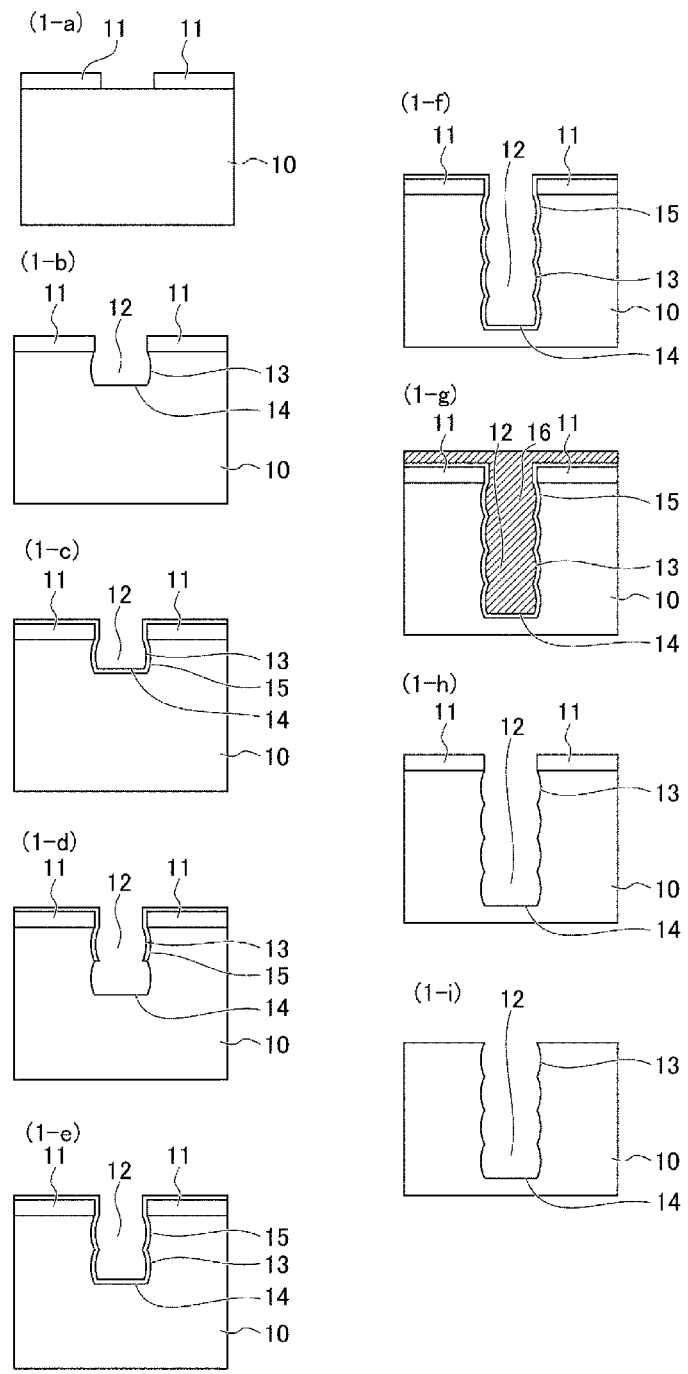
FIG. 1 shows diagrams schematically illustrating a method of etching a substrate according to the third aspect of the present invention.

First, a cleaning liquid according to the first aspect of the present invention will be described.

The cleaning liquid according to the first aspect includes (A1) 3-alkoxy-3-methyl-1-butanol represented by the following general formula (1), (A2) at least one monomethyl ether compound selected from the group consisting of diethylene glycol monomethyl ether and triethylene glycol monomethyl ether, and (B) quaternary ammonium hydroxide.

Hereinafter, (A1) 3-alkoxy-3-methyl-1-butanol represented by the above-described general formula (1), (A2) at least one monomethyl ether compound selected from the group consisting of diethylene glycol monomethyl ether and triethylene glycol monomethyl ether, (B) quaternary ammonium hydroxide, other components, and a method of preparing the cleaning liquid will be sequentially described.

(A1) 3-Alkoxy-3-methyl-1-butanol Represented by the Above-Described General Formula (1) (Hereinafter, Also Referred to as Component (A1))

Examples of an alkyl group having 1 to 5 carbon atoms which is represented by $R^1$ include a methyl group, an ethyl group, a n-propyl group, an isopropyl group, a n-butyl group, an isobutyl group, a t-butyl group, and a n-pentyl group. Among them, from the viewpoint of dissolving power, the alkyl group having 1 to 3 carbon atoms is preferable, the methyl group or the ethyl group is further preferable, and is the methyl group is still further preferable.

As the component (A1), 3-methoxy-3-methyl-1-butanol (MMB) is preferable.

The component (A1) may be used alone, or two or more types thereof represented by the above-described general formula (1) may be used in combination.

(A2) at Least One Monomethyl Ether Compound Selected from the Group Consisting of Diethylene Glycol Monomethyl Ether and Triethylene Glycol Monomethyl Ether The cleaning liquid according to the first aspect contains (A2) at least one monomethyl ether compound selected from the group consisting of diethylene glycol monomethyl ether and triethylene glycol monomethyl ether (hereinafter, also referred to as component (A2)).

Diethylene glycol monomethyl ether and triethylene glycol monomethyl ether can be used in combination.

The ratio [a1/(a1+a2)] of the content [a1] of the (A1) 3-alkoxy-3-methyl-1-butanol to a total of the content [a1] and the content [a2] of the (A2) monomethyl ether compound is not particularly limited, but is preferably 65% to 95% by mass, is further preferably 68% to 93% by mass, and is still further preferably 70% to 90% by mass, on a mass basis.

(B) Quaternary Ammonium Hydroxide

The cleaning liquid according to the first aspect contains (B) quaternary ammonium hydroxide (hereinafter, also referred to as component (B)). The (B) quaternary ammonium hydroxide is not particularly limited to the extent not hindering the object of the present invention. The (B) quaternary ammonium hydroxide can be properly selected from materials that are used in a cleaning liquid which is used in the related art in a method of processing various substrates with a resist material, or in a method of processing the substrate through etching.

Preferred examples of the (B) quaternary ammonium hydroxide include compounds represented by the following formula (3).

In the above-described formula (3), $R^{11}$ to $R^{14}$ each independently represent an alkyl group or a hydroxyalkyl group each having 1 to 4 carbon atoms.

Among the compounds represented by the above-described formula (3), a tetramethyl ammonium hydroxide, a tetraethyl ammonium hydroxide, a tetrapropyl ammonium hydroxide, a tetrabutyl ammonium hydroxide, a methyl tripropyl ammonium hydroxide, a methyl tributyl ammonium hydroxide, and (2-hydroxyethyl) trimethyl ammonium hydroxide are preferably used from the viewpoint of the availability. Further, from the viewpoint of easily obtaining the cleaning liquid with which a resist material and a fluorocarbon can be cleaned well, the tetramethyl ammonium hydroxide and the tetraethyl ammonium hydroxide are particularly preferable.

The content of the component (B) in the cleaning liquid according to the first aspect is not particularly limited as long as the cleaning liquid in which the respective components are uniformly dissolved can be prepared. The content of the component (B) in the cleaning liquid according to the first aspect is preferably 0.5% to 10% by mass, is further preferably 1% to 8% by mass, and still further preferably 2% to 6% by mass with respect to the mass of the cleaning liquid.

Water

The cleaning liquid according to the first aspect may or may not contain water.

From the viewpoint of detergency of the cleaning liquid, the content of water is preferably equal to or less than 40% by mass, and is further preferably equal to or less than 30% by mass with respect to the mass of the cleaning liquid. In addition, from the viewpoint of the safety, the content of the water is equal to or greater than 15% by mass with respect to the mass of the cleaning liquid.

In the case where the cleaning liquid contains water, the content [a1] of (A1) 3-alkoxy-3-methyl-1-butanol is preferably greater than 40% by mass and equal to or less than 65% by mass, and is further preferably 45% by mass to 60% by mass, with respect to the mass of the cleaning liquid.

In the case where the cleaning liquid does not contain water, the content [a1] of (A1) 3-alkoxy-3-methyl-1-butanol is preferably 40% to 95% by mass, is further preferably 65% to 95% by mass, and is still further preferably 68% to 93% by mass, and 70% to 90% by mass, with respect to the mass of the cleaning liquid.

(C) Other Components

In the cleaning liquid according to the first aspect, an organic solvent may contain only the component (A1) and the component (A2). Here, to the extent not hindering the object of the present invention, the organic solvent also may contain (C) other components (hereinafter, also referred to as component (C)) such as alkylene glycol monoalkyl ether other than (A2) at least one monomethyl ether compound selected from the group consisting of diethylene glycol monomethyl ether and triethylene glycol monomethyl ether, polyhydric alcohol, a surfactant, and an anticorrosion agent or may not contain the component (C).

The alkylene glycol monoalkyl ether other than the component (A2) may be contained from the viewpoint of preventing the components from being separated from each other particularly in the case where water is not contained in the cleaning liquid.

Examples of the alkylene glycol monoalkyl ether except for the component (A2) include diethylene glycol monoethyl ether, diethylene glycol mono-n-butyl ether, and dipropylene glycol monomethyl ether. Among them, diethylene glycol monoethyl ether and diethylene glycol mono-n-butyl ether are preferable.

The content of the alkylene glycol monoalkyl ether other than the component (A2) is not particularly limited, and is preferably 0.1% to 30% by mass, and is further preferably 1% to 20% by mass, with respect to the mass of the cleaning liquid.

The polyhydric alcohol may be contained from the viewpoint of preventing the components from being separated from each other particularly in the case where water is not contained in the cleaning liquid.

The polyhydric alcohol is not particularly limited, and examples thereof include ethylene glycol, diethylene glycol, propylene glycol, glycerin, 1,2-butylene glycol, 1,3-butylene glycol, and 2,3-butylene glycol. Among them, propylene glycol is preferable. The polyhydric alcohol can be used alone or two or more types thereof can be used.

The above content of the polyhydric alcohol with respect to the mass of the cleaning liquid is not particularly limited, and is preferably 0.1% to 30% by mass, and is further preferably 1% to 20% by mass.

The types of the surfactants are not particularly limited. Examples of preferred surfactants include an amine-based activator in which an alkyl group or an oxyalkyl group having at least 10 or more carbon atoms is substituted, an acetylene alcohol-based activator, and a diphenyl ether-based activator in which at least one alkyl group having 7 or more carbon atoms is substituted.

The anticorrosion agent is used to suppress corrosion of metal materials such as copper formed on the substrate due to the cleaning liquid. Preferred examples of the anticorrosion agent include an aromatic hydroxy compound (for example, pyrocatechol, tert-butylcatechol, pyrogallol, and gallic acid), a triazole compound (for example, a benzotriazole), a mercapto group-containing compound, an imidazole compound, and a sugar alcohol base (for example, xylitol and sorbitol). Among them, from the viewpoint of an anticorrosion effect with respect to metal or the like, the mercapto group-containing compound and the imidazole compound mercapto are preferable. Preferred examples of the mercapto group-containing compound include compounds represented by the following formulae (4) and (5).

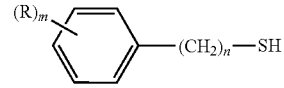

(4)

In formula (4), R is a group selected from the group consisting of a hydroxyl group, an alkyl group having 1 to 4 carbon atoms, an alkoxy group having 1 to 4 carbon atoms, an alkylthio group having 1 to 4 carbon atoms, a hydroxyalkyl group having 1 to 4 carbon atoms, a mercaptoalkyl group having 1 to 4 carbon atoms, a halogenated alkyl group having 1 to 4 carbon atoms, and a halogen atom, m is an integer of 1 to 3, n is an integer of 0 to 3, and in the case where m is 2 or 3, R's may be the same as or different from each other.

(5)

In formula (5), x is an integer of equal to or greater than 3.

In the case where R in formula (4) represents an alkyl group having 1 to 4 carbon atoms that may have a hydroxyl group, specific examples of the alkyl group include a methyl group, an ethyl group, a n-propyl group, an iso-propyl group, a n-butyl group, an iso-butyl group, a sec-butyl group, and a tert-butyl group. Among such alkyl groups, from the viewpoint that the solubility in a $(C^1)$ organic solvent is suitable, a methyl group, a hydroxy methyl group, or an ethyl group is preferable, and from the viewpoint that the anticorrosion effect is further improved, a methyl group or a hydroxy methyl group is further preferable.

In the case where R represents an alkoxy group having 1 to 4 carbon atoms in formula (4), specific examples of the alkoxy group include a methoxy group, an ethoxy group, a n-propyloxy group, an iso-propyloxy group, a n-butyloxy group, an iso-butyloxy group, a sec-butyloxy group, and a tert-butyloxy group. Among such alkoxy groups, from the viewpoint that the solubility in the component (A1) and the component (A2) is suitable, a methoxy group or an ethoxy group is preferable, and from the viewpoint that the anticorrosion effect is further improved, a methoxy group is further preferable.

In the case where R is an alkylthio group having 1 to 4 carbon atoms in formula (4), specific examples of the alkylthio group include a methylthio group, an ethylthio group, a n-propylthio group, an iso-propylthio group, a n-butylthio group, an iso-butylthio group, a seC-butylthio group, and a tert-butylthio group. Among such alkylthio groups, from the viewpoint that the solubility in the component (A1) and the component (A2) is suitable, a methylthio group or an ethylthio group is preferable, and from the viewpoint that the anticorrosion effect is further improved, a methylthio group is further preferable.

In the case where R represents a hydroxy alkyl group having 1 to 4 carbon atoms in formula (4), specific examples of the hydroxy alkyl group include a hydroxy methyl group, a 2-hydroxy ethyl group, a 1-hydroxy ethyl group, a 3-hydroxy-n-propyl group, and a 4-hydroxy-n-butyl group. Among such hydroxy alkyl groups, from the viewpoint that the solubility in the component (A1) and the component (A2) is suitable, a hydroxy methyl group, a 2-hydroxy ethyl group, or a 1-hydroxy ethyl group is preferable, and from the viewpoint that the anticorrosion effect is further improved, a hydroxy methyl group is further preferable.

In the case where R represents a mercapto alkyl group having 1 to 4 carbon atoms in formula (4), specific examples of the mercapto alkyl group include a mercapto methyl group, a 2-mercapto ethyl group, a 1-mercapto ethyl group, a 3-mercapto-n-propyl group, and a 4-mercapto-n-butyl group. Among such mercapto alkyl groups, from the viewpoint that the solubility in a ($C^1$) organic solvent is suitable, a mercapto methyl group, a 2-mercapto ethyl group, or a 1-mercapto ethyl group is preferable, and from the viewpoint that the anticorrosion effect is further improved, a mercapto methyl group is further preferable.

In the case where R represents a halogenated alkyl group having 1 to 4 carbon atoms in formula (4), examples of the halogen atom contained in the halogenated alkyl group include fluorine, chlorine, bromine, and iodine. In the case where R represents a halogenated alkyl group having 1 to 4 carbon atoms, specific examples thereof include a chloromethyl group, a bromomethyl group, an iodomethyl group, a fluoromethyl group, a dichloromethyl group, a dibromomethyl group, a difluoromethyl group, a trichloromethyl group, a tribromomethyl group, a trifluoromethyl group, a 2-chloroethyl group, a 2-bromoethyl group, a 2-fluoroethyl group, a 1,2-dichloroethyl group, a 2,2-difluoroethyl group, a 1-chloro-2-fluoroethyl group, 3-chloro-n-propyl group, 3-bromo-n-propyl group, 3-fluoro-n-propyl group, and 4-chloro-n-butyp group. Among such halogenated alkyl groups, a chloromethyl group, a bromomethyl group, an iodomethyl group, a fluoromethyl group, a dichloromethyl group, a dibromomethyl group, a fluoromethyl group, a trichloromethyl group, a tribromomethyl group, or a trifluoromethyl group is preferable, and from the viewpoint that the anticorrosion effect is further improved, a chloromethyl group, a dichloromethyl group, a trichloromethyl group, or a trifluoromethyl group is further preferable.

In the case where R represents a halogen atom, specific examples thereof include fluorine, chlorine, bromine, and iodine.

In formula (4), m is an integer of 1 to 3, and 1 is further preferable. In the case where m is 2 or 3, R's may be the same as or different from each other.

In the compound represented by formula (4), a substitution position of R on a benzene ring is not particularly limited. From the viewpoint that the improved anticorrosion effect is easily obtained, the substitution position of R on the benzene ring is preferably a meta-position or a para-position with respect to a bonding position of —$(CH_2)_n$—SH.

As the compounds represented by formula (4), from the viewpoint of high anticorrosion effect with respect to the metal such as copper, and excellent stability in the cleaning liquid, a compound which has at least one group selected from the group consisting of an alkyl group, a hydroxy alkyl group, and a mercapto alkyl group as R is preferable, and a compound which has one selected from the group consisting of alkyl group, a hydroxy alkyl group, and a mercapto alkyl group as R is further preferable. In the case where the compounds represented by formula (4) have one group selected from the group consisting of an alkyl group, a hydroxy alkyl group, and a mercapto alkyl group as R, the substitution position of the alkyl group, the hydroxy alkyl group, or the mercapto alkyl group on a benzene ring is preferably a meta-position or a para-position, and is further preferably the para-position, with respect to a bonding position of —$(CH_2)_n$—SH.

In formula (4), n is an integer of 0 to 3. From the viewpoint that it is easy to prepare and obtain the compound, n is preferably 0 or 1, and is further preferably 0.

Specific examples of the compounds represented by formula (4) include p-mercapto phenol, p-thiocresol, m-thiocresol, 4-(methylthio) benzenethiol, 4-methoxy benzenethiol, 3-methoxy benzenethiol, 4-ethoxy benzenethiol, 4-isopropyloxy benzenethiol, 4-tert-butoxy benzenethiol, 3,4-dimethoxy benzenethiol, 3,4,5-trimethoxy benzenethiol, 4-ethyl benzenethiol, 4-isopropyl benzenethiol, 4-n-butyl benzenethiol, 4-tert-butyl benzenethiol, 3-ethyl benzenethiol, 3-isopropyl benzenethiol, 3-n-butyl benzenethiol, 3-tert-butyl benzenethiol, 3,5-dimethyl benzenethiol, 3,4-dimethyl benzenethiol, 3-tert-butyl-4-methyl benzenethiol, 3-tert-4-methyl benzenethiol, 3-tert-butyl-5-methyl benzenethiol, 4-tert-butyl-3-methylbenzenethiol, 4-mercaptobenzyl alcohol, 3-mercaptobenzyl alcohol, 4-(mercaptomethyl) phenol, 3-(mercapto methyl) phenol, 4-fluoro benzenethiol, 3-fluoro benzenethiol, 4-chloro benzenethiol, 3-chloro benzenethiol, 4-bromo benzenethiol, 4-iodo benzenethiol, 3-bromo benzenethiol, 3,4-dichloro benzenethiol, 3,5-dichloro benzenethiol, 3,4-difluoro benzenethiol, 3,5-difluoro benzenethiol, 4-mercapto catechol, 2,6-di-tert-butyl-4-mercaptophenol, 3,5-di-tert-butyl-4-methoxy benzenethiol, 4-bromo-3-methyl benzenethiol, 4-(trifluoromethyl) benzenethiol, 3-(trifluoromethyl) benzenethiol, 3,5-bis(trifluoromethyl) benzenethiol, 4-methyl thiobenzenethiol, 4-ethyl thiobenzenethiol, 4-n-butyl thiobenzenethiol, and 4-tert-butyl thiobenzenethiol. Among the compounds, from the viewpoint of high anticorrosion effect with respect to the metal such as copper and easy availability, p-mercaptophenol, p-thiocresol, m-thiocresol, 4-(methylthio) benzenethiol, 4-methoxy benzenethiol, 4-ethyl benzenethiol, 4-isopropyl benzenethiol, 4-fluoro benzenethiol, 4-chloro benzenethiol, and 4-bromo benzenethiol are further preferable. In addition, from the viewpoint of high anticorrosion effect with respect to the metal such as copper, and excellent stability in the cleaning liquid, 4-mercapto benzenethiol and 4-(mercaptomethyl) phenol are also preferable.

In formula (5), x is an integer of equal to or greater than 3, and the upper limit is not particularly limited to the extent not hindering the object of the present invention. From the viewpoint that it is possible to successfully suppress the corrosion of the metal such as copper by the cleaning liquid, x is preferably an integer of 3 to 10, and is further preferably an integer of 3 to 9.

Preferred examples of the compounds represented by formula (5) include HS—$(CH_2)_3$—OH; HS—$(CH_2)_4$—OH; HS—$(CH_2)_5$—OH; HS—$(CH_2)_6$—OH; HS—$(CH_2)_7$—OH; HS—$(CH_2)_8$—OH; HS—$(CH_2)_9$—OH; and HS—$(CH_2)_{10}$—OH.

Examples of other mercapto group-containing compounds include a mercaptopropionic acid, a mercaptoacetic acid, a mercaptobenzoic acid, a mercaptosuccinic acid, a mercaptopropanesulfonic acid, and a mercaptosuccinic acid. In addition, examples of the imidazole compound include 2-ethyl-4-methyl imidazole, 2-mercapto imidazole, and 2-mercapto-1-methyl imidazole.

The content of the anticorrosion agent in the cleaning liquid is preferably 0.05% to 5.0% by mass, and is further preferably 0.1% to 1.0% by mass, with respect to the mass of the cleaning liquid.

Method of Preparing Cleaning Liquid

The method of preparing cleaning liquid according to the first aspect is not particularly limited. The cleaning liquid according to the first aspect can be prepared by mixing the (A1) 3-alkoxy-3-methyl-1-butanol represented by the above-described general formula (1), the (A2) at least one monomethyl ether compound selected from the group consisting of diethylene glycol monomethyl ether and triethylene glycol monomethyl ether, the (B) quaternary ammonium salt, and if necessary, water and (C) other components, and stirring the mixture with a stirrer such that the respective components in the mixture are uniformly dissolved.

With the above-described cleaning liquid according to the first aspect, the fluorocarbon layer, the resist film (particularly, the crosslinking type negative resist film), the polyimide layer, and the like can be removed by a BOSCH method.

Removing Method According to Second Aspect

According to a second aspect of the present invention, a method of removing at least one target to be removed selected from the group consisting of a resist pattern, a fluorocarbon layer, and a polyimide layer, the removing method including a step of removing the target to be removed with the cleaning liquid of the first aspect, in which the target to be removed is formed in a semiconductor manufacturing step.

According to the removing method in the second aspect, it is possible to remove the target to be removed which is formed in the semiconductor manufacturing step. For example, it is possible to remove a fluorocarbon layer formed as a protective film for surface inactivation, an organic insulating film (for example, a polyimide layer), and a resist pattern in the BOSCH method.

The thickness of the fluorocarbon layer, the resist pattern, and the polyimide layer which are targets to be removed is not particularly limited. For example, the thickness is 10 μm or less, is preferably 5 nm to 10 μm, and is further preferably 10 nm to 5 μm.

As one embodiment of the removing method according to the second aspect, a removing method of a resist pattern can be exemplified.

The removing method includes a step of removing the resist pattern with the cleaning liquid according to the first aspect, in which the resist pattern is a pattern which is formed by exposing and developing the resist film formed by applying a resist composition onto the surface of the substrate.

As another embodiment of the removing method according to the second aspect, a removing method of a fluorocarbon layer which is formed as a protective film for surface inactivation in the BOSCH method is exemplified.

Specifically, the removing method of a fluorocarbon layer includes a step of removing the fluorocarbon layer with the cleaning liquid according to the first aspect, in which the fluorocarbon layer is a layer which is formed on side wall of a recessed portion formed by etching on the surface of a substrate.

As still another embodiment of the removing method according to the second aspect, a removing method of a polyimide layer used as an organic insulating film or the like can be exemplified.

Specifically, the removing method includes a step of removing the polyimide layer with the cleaning liquid according to the first aspect, in which the polyimide layer is a layer containing polyimide which is formed on the substrate.

Method of Etching Substrate According to Third Aspect

According to a third aspect of the present invention, a method of etching a substrate includes (A-I) an etching mask pattern forming step of forming an etching mask pattern on a surface of a substrate, (A-II) a first etching step of etching the surface of the substrate that is exposed through the etching mask pattern to form a recessed portion, (A-III) a recessed portion forming step of forming a recessed portion having a predetermined depth on a substrate by repeatedly performing the following steps (i) and (ii) until a recessed portion having the predetermined depth is formed, [(i) a fluorocarbon layer forming step of forming a fluorocarbon layer on a side wall of a recessed portion of the surface of the substrate, which is formed by etching, and (ii) a second etching step of etching a bottom face of the recessed portion], and (A-IV) a fluorocarbon layer removing step of removing the fluorocarbon layer with the cleaning liquid after forming the recessed portion having the predetermined depth, in which in the fluorocarbon layer removing step, as the cleaning liquid, the cleaning liquid according to the first aspect is used.

Hereinafter, the method of etching a substrate according to the third aspect will be described with reference to FIG. 1.

(A-I) Etching Mask Pattern Forming Step

In the (A-I) etching mask pattern forming step, as illustrated in FIG. 1, 1-a, an etching mask pattern 11 which has an opening portion in a predetermined pattern is formed on a surface of a substrate 10 such as a silicon substrate.

The thickness of the etching mask pattern 11 is not particularly limited, and is preferably 10 nm to 10 μm, and is further preferably 50 nm to 5 μm.

The material of the etching mask pattern 11 is not particularly limited. A preferred material of the etching mask pattern 11 may be properly selected from various resist materials and inorganic silicon compounds such as $SiO_2$ and SiN.

In the case where the etching mask pattern 11 is a resist pattern formed of a resist material, the method of forming a resist pattern is not particularly limited, and is performed by using various resist compositions in accordance with any photolithography method.

In the case where the etching mask pattern 11 is made of an inorganic silicon compound, the etching mask pattern 11 can be formed in such a manner that an etching mask layer made of the inorganic silicon compound is formed on the surface of the substrate 10, then a resist pattern having an opening portion is formed on a position corresponding to the opening portion of the etching mask pattern 11 on the etching mask layer made of the inorganic silicon compound, the etching mask layer made of inorganic silicon compounds, which is exposed through the opening portion of the resist pattern, is released through the etching, and then the resist pattern is removed.

Further, the etching mask pattern 11 can be also formed by using a method of forming a resist pattern having an opening portion in a position corresponding to the etching mask pattern 11, then depositing a inorganic silicon compound in the opening portion of the resist pattern by using a CVD method, and then removing the resist pattern.

(A-II) First Etching Step

In the (A-II) first etching step, as illustrated in FIGS. 1, 1-a and 1-b, the surface of the substrate 10 that is exposed through the etching mask pattern 11 is etched to form a recessed portion 12. In the first etching step, a method of etching the surface of the substrate 10 exposed through the etching mask pattern 11 is not particularly limited. In the BOSCH method, the substrate 10 is typically etched through isotropic plasma etching in which $SF_6$ gas is used.

(A-III) Second Etching Step

In the (A-III) recessed portion forming step, the recessed portion 12 having a predetermined depth is formed on the substrate 10 by repeatedly performing the following steps until a recessed portion having the predetermined depth is formed: (i) fluorocarbon layer forming step of forming a fluorocarbon layer 15 as a protective film for surface inactivation such that a side wall 13 and a bottom face 14 of the recessed portion 12 which is formed in the (A-II) first etching step, and the etching mask pattern 11 are covered, as illustrated in FIGS. 1, 1-b and 1-c; and (ii) second etching step of etching the bottom face 14 of the recessed portion 12 in which the fluorocarbon layer 15 is formed, as illustrated in FIGS. 1, 1-c and 1-d.

In the (i) fluorocarbon layer forming step, the method of forming the fluorocarbon layer 15 on an inner surface of the recessed portion 12 is not particularly limited. In the BOSCH method, typically, the fluorocarbon layer 15 is formed on the inner surface of the recessed portion 12 by circulating $C_4F_8$ gas into the recessed portion, and then performing plasma polymerization.

The thickness of the fluorocarbon layer 15 is not particularly limited, is preferably 1 nm to 500 nm, and is further preferably 1 nm to 300 nm.

The etching method in the (ii) second etching step is not particularly limited. Typically, in the (ii) second etching step, the bottom face 14 of the recessed portion 12 is etched similarly to the first etching step.

In the (A-III) recessed portion forming step, as illustrated in FIG. 1, 1-d to 1-f, the steps (i) and (ii) in which the fluorocarbon layer is formed on a side wall 13 of the recessed portion 12 such that the side wall 13 is less likely to be etched, and then the bottom face 14 is etched are repeatedly performed predetermined number of times so as to form the recessed portion 12 having a sufficient depth without widening a diameter of the recessed portion 12.

The depth of the recessed portion 12 is not particularly limited, and is preferably 5 nm to 200 μm, and is further preferably 5 nm to 150 μm.

(A-IV) Fluorocarbon Layer Removing Step

In the (A-IV) fluorocarbon layer removing step, the fluorocarbon layer 15 which is formed so as to cover the side wall 13 and the bottom face 14 of the recessed portion 12, and the etching mask pattern 11 is removed with a cleaning liquid 16 according to the first aspect, as illustrated in FIG. 1, 1-f to 1-h. The method of removing the fluorocarbon layer by the cleaning liquid 16 is not particularly limited; however, from the viewpoint that it is easy to bring the cleaning liquid 16 into contact with the entire recessed portion 12, a method of dipping the substrate 10 into the cleaning liquid 16 is preferable.

Note that, the fluorocarbon layer 15 may be removed before or after removing the etching mask pattern 11. FIG. 1, 1-g illustrates that the fluorocarbon layer 15 is removed before removing the etching mask pattern 11. In the case where the etching mask pattern 11 is made of an inorganic silicon compound such as $SiO_2$ or SiN, for example, it is possible to remove the etching mask pattern 11 with a cleaning liquid containing a hydrofluoric acid.

When the removing of the etching mask pattern 11, and the removing of the fluorocarbon layer 15 in the (A-IV) fluorocarbon layer removing step are performed, the substrate 10 including the recessed portion 12 having a predetermined depth can be obtained as illustrated in FIG. 1, 1-i.

In the method of etching a substrate according to the third aspect of the present invention, it is preferable that the etching mask pattern 11 is formed by the following steps (B-I) to (B-III): (B-I) resist film forming step of forming a resist film 2 by applying a resist composition onto the surface of the etching mask layer 1, (B-II) resist pattern forming step of forming a resist pattern 3 having a predetermined pattern by exposing and developing the resist film 2, and (B-III) etching mask pattern forming step of forming an etching mask pattern 11 by etching the surface of the etching mask layer 1 exposed through the resist pattern 3.

Figure 2:
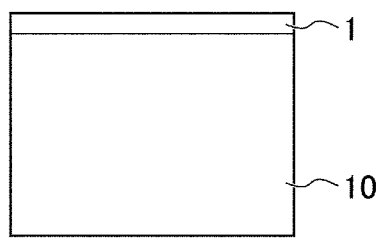
FIG. 2 shows diagrams schematically illustrating etching mask pattern forming in the method of etching a substrate according to the third aspect of the present invention.
Figure 2:
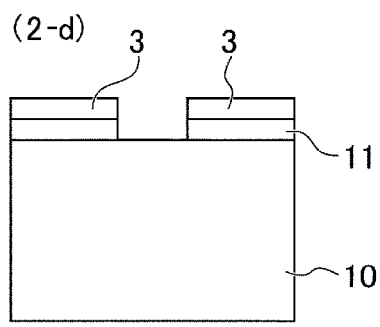
Figure 2:
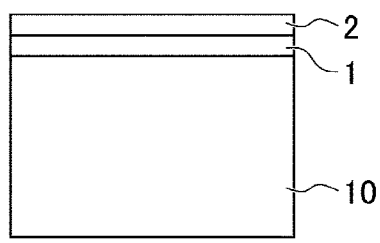
Figure 2:
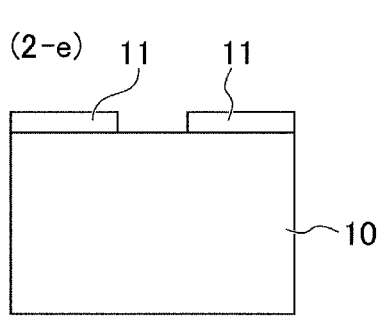
Figure 2:
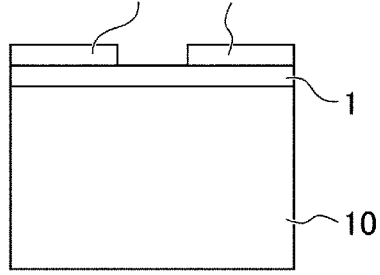

FIG. 2 is a diagram schematically illustrating etching mask pattern forming in the method of etching a substrate according to the third aspect of the present invention.

(B-I) Resist Film Forming Step and (B-II) Resist Pattern Forming Step

In the (B-I) resist film forming step and the (B-II) resist pattern forming step, a resist film 2 is formed on the surface of an etching mask layer 1 by using the resist composition as illustrated in FIGS. 2, 2-a and 2-b, and a resist pattern 3 having an opening portion at a position corresponding to the opening portion of the etching mask pattern 11 is formed as illustrated in FIG. 2, 2-c.

The thickness of the resist pattern 3 is not particularly limited. For example, the thickness is 20 μm or less, is preferably 10 nm to 15 μm, and is further preferably 1 μm to 10 μm.

The method of forming the resist pattern 3 by forming the resist film 2 with the resist composition is not particularly limited, and is performed in accordance with any photolithography method.

(B-III) Etching Mask Pattern Forming Step

In the (B-III) etching mask pattern forming step, the etching mask layer 1 which is exposed through the opening portion of the resist pattern 3 formed in the (B-II) resist pattern forming step is etched, as illustrated in FIGS. 2, 2-c and 2-d.

Then, as illustrated in FIG. 2, 2-e, the resist pattern 3 is removed.

The method of removing the resist pattern is not particularly limited, but it is preferable to remove the resist pattern with the cleaning liquid according to the first aspect.

The method of etching a substrate according to the third aspect preferably further includes (B-IV) resist pattern removing step of removing the resist pattern 3 with the cleaning liquid according to the first aspect after the (B-III) etching mask pattern forming step, as illustrated in FIGS. 2, 2-d and 2-e.

In the case where the resist pattern is removed with the cleaning liquid according to the first aspect, a method of removing the resist pattern is not particularly limited, and is properly selected from any methods. Specific examples of the preferred methods include a dipping method, and a shower method.

Method of Etching Substrate According to Fourth Aspect

The method of etching a substrate according to the third aspect of the present invention is preferably a method of etching a substrate according to the fourth aspect of the present invention.

According to a fourth aspect of the present invention, a method of etching a substrate includes (C-I) an etching mask layer forming step of forming an etching mask layer on the surface of a substrate, (C-II) a resist film forming step of forming a resist film by applying a resist composition onto the etching mask layer, (C-III) a resist pattern forming step of exposing and developing the resist film, (C-IV) an etching mask pattern forming step of etching the etching mask layer exposed through an opening portion of the resist pattern to form an etching mask pattern, and then removing the resist pattern with a cleaning liquid, (C-V) a first etching step of etching the surface of the substrate exposed through the etching mask pattern to form a recessed portion, (C-VI) a recessed portion forming step of forming a recessed portion having a predetermined depth on a substrate by repeatedly performing the following steps (i) and (ii) until a recessed portion having the predetermined depth is formed, [(i) a fluorocarbon layer forming step of forming a fluorocarbon layer on a side wall of a recessed portion of the surface of the substrate, which formed by etching, and (ii) a second etching step of etching a bottom face of the recessed portion], and (C-VII) a fluorocarbon layer removing step of removing the fluorocarbon layer with the cleaning liquid after forming the recessed portion having the predetermined depth, in which in the etching mask pattern forming step and/or the fluorocarbon layer removing step, as the cleaning liquid, the cleaning liquid according to the first aspect is used.

(C-I) Etching Mask Layer Forming Step

Regarding the etching method according to the fourth aspect, in the (C-I) etching mask layer forming step, an etching mask layer 1 made of SiO₂, SiN, and the like is formed on a surface of a substrate 10. The method of forming the etching mask layer 1 on the surface of the substrate 10 is not particularly limited, and examples thereof include a CVD method.

(C-II) Resist Film Forming Step and (C-III) Resist Pattern Forming Step

In the (C-II) resist film forming step and (C-III) resist pattern forming step, a resist film 2 is formed on the surface of the etching mask layer 1 by using a resist composition, and a resist pattern 3 having an opening portion at a position corresponding to an opening portion of an etching mask pattern 11 is formed. The method of forming the resist pattern 3 by forming the resist film 2 with the resist composition is not particularly limited, and is performed in accordance with any photolithography method.

(C-IV) Etching Mask Pattern Forming Step

In the (C-IV) etching mask pattern forming step, the etching mask layer 1 which is exposed through the opening portion of the resist pattern formed in the (C-III) resist pattern forming step is etched to form an etching mask pattern 11.

Then, the resist pattern is removed with the cleaning liquid according to the first aspect. In the case where the resist pattern is removed with the cleaning liquid according to the first aspect, the resist pattern is removed similarly to the (B-IV) resist pattern removing step of the etching method according to the third aspect.

(C-V) First Etching Step

In the etching method according to the fourth aspect, similarly to the (A-II) first etching step in the etching method according to the third aspect, in the (C-V) first etching step, the surface of the substrate 10 exposed through the etching mask pattern 11 is etched to form a recessed portion 12.

(C-VI) Recessed Portion Forming Step

In the etching method according to the fourth aspect, similarly to the (A-III) recessed portion forming step according to the third aspect, in the (C-VI) recessed portion forming step, a recessed portion 12 having a predetermined depth is formed on the substrate 10 by repeatedly performing the following steps predetermined number of times: (i) fluorocarbon layer forming step of forming a fluorocarbon layer 15 so as to cover the side wall 13 and the bottom face 14 of the recessed portion 12 formed in the (C-V) first etching step, and the etching mask pattern 11; and (ii) second etching step of etching the bottom face 14 of the recessed portion 12 in which the fluorocarbon layer 15 is formed.

(C-VII) Fluorocarbon Layer Removing Step

In the etching step according to the fourth aspect, similarly to the (A-IV) fluorocarbon layer removing step in the etching method according to the third aspect, a fluorocarbon layer 15, which is formed so as to cover the side wall 13 and the bottom face 14 of the recessed portion 12 having a predetermined depth, and the etching mask pattern 11, is removed.

In the method of etching a substrate according to the fourth aspect, similarly to the method of etching a substrate according to the third aspect, the etching mask pattern 11 is removed.

Note that, in the (C-IV) etching mask layer forming step and the (C-VII) fluorocarbon layer removing step, the cleaning liquid according to the first aspect is used in at least one of the steps, and the cleaning liquid according to the first aspect is preferably used in both of the steps.

Examples

Hereinafter, the present invention will be more specifically described with reference to the examples; however, the present invention is not limited to the examples.

In examples and comparative example, as (A1) 3-alkoxy-3-methyl-1-butanol represented by the above-described general formula (1), (A2) at least one monomethyl ether compound selected from the group consisting of diethylene glycol monomethyl ether and triethylene glycol monomethyl ether, and (B) quaternary ammonium hydroxide, the following were used. In addition, as water and other components, the following were used.

The compositions of the cleaning liquids are indicated in Table 1.

Component (A1)
MMB: 3-methoxy-3-methyl-1-butanol
Components (A2)
MDG: diethylene glycol monomethyl ether
MTG: triethylene glycol monomethyl ether
Other Organic Solvents
EDG: diethylene glycol monoethyl ether
BDG: diethylene glycol monobutyl ether
DPM: dipropylene glycol monomethyl ether
PG: propylene glycol
(B) quaternary ammonium hydroxide
tetramethyl ammonium hydroxide
Water
DIW: distilled water Examples 1 to 11 and Comparative Examples 1 to 9

In accordance with the compositions indicated in Table 1, cleaning liquids in Examples 1 to 11 and Comparative Examples 1 to 9 were prepared. Regarding the cleaning liquids in Examples 1 to 11 and Comparative Examples 1 to 9, removing performance of a fluorocarbon layer, removing performance of a resist material, removing performance of a polyimide film, and phase separation properties were evaluated according to the following method. The following test results are indicated in Table 1. Note that, only the examples in which the evaluation of the removing performance of the resist material, and the phase separation properties were good were evaluated for the removing performance of the fluorocarbon layer, the removing performance of the polyimide film.

Fluorocarbon Layer Removing Test

A substrate on which a fluorocarbon layer having a thickness of approximately 100 nm was deposited was used as a test substrate for a fluorocarbon layer removal test. The cleaning liquid was heated at 70° C., and then a test substrate piece (2 cm×4 cm) was dipped into the heated cleaning liquid for five minutes.

After being dipped, the test substrate piece was extracted from the cleaning liquid, and the test substrate piece was washed with pure water. After washing with pure water, nitrogen gas was blown onto the substrate surface to remove water and dry the substrate surface.

The dried surface of the test substrate was observed with a scanning electron microscope, and then removability of the fluorocarbon layer by the cleaning liquid was evaluated. A case where the fluorocarbon layer was completely removed was evaluated as A. In addition, a case where the fluorocarbon layer was not completely removed was evaluated as B.

Resist Film Removing Test

As the resin mixed into the resist composition, resins represented by the following formula were used. In the following formula, the lower right numerical value of each unit is the number of mass parts of each unit in 100 parts by mass of the resin. In addition, the mass average molecular weight of the resin represented by the following formula is 20,000.

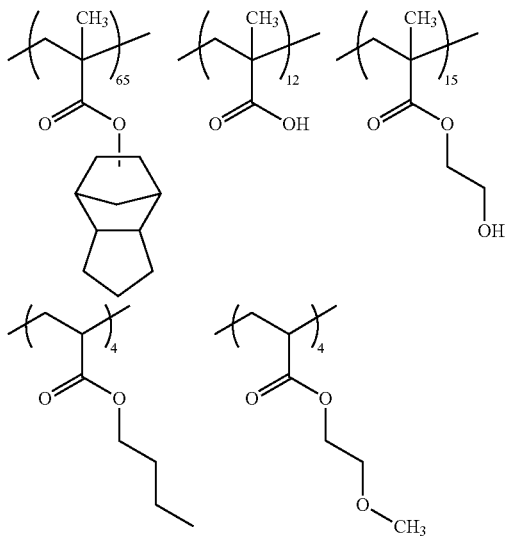

100 parts by mass of a resin represented by the above-described formula, 8 parts by mass of 2,2-dimethoxy-1,2-diphenylethan-1-one (photopolymerization initiator, Product name, IRGACURE 651, prepared by Ciba Japan K.K.), 4 parts by mass of 2-(o-chlorophenyl)-4,5-diphenyl imidazole dimer, 30 parts by mass of ethylene oxide modified trimethylolpropane triacrylate (Product name, ARONIX M-350, prepared by Toagosei Co., Ltd.), 10 parts by mass of polyethylene glycol diacrylate (Product name, NK ESTER A-200, prepared by SHIN-NAKAMURA CHEMICAL CO., LTD.), 10 parts by mass of N-vinyl pyrrolidone (Product name, ARONIX M-150, prepared by Toagosei Co., Ltd.) and 0.1 parts by mass of methyl hydroquinone (polymerization inhibitor) were dissolved into 100 parts by mass of mixed solvent in which the mass ratio of propylene glycol monomethyl ether acetate to methyl isobutyl ketone is 1:1 so as to obtain a resist composition.

As the substrate, a silicon substrate having a size of 2 cm×4 cm was used. The substrate was coated with the resist composition, and was subjected to a bake treatment at 120° C. for 300 seconds, thereby forming a resist film having a thickness of approximately 5 μm. After that, the resist film was exposed and cured by using a UV irradiation device (broadband light of ghi rays). A silicon substrate including the obtained resist film was used as a test substrate.

The cleaning liquid was heated at 70° C., and then a test substrate piece (2 cm×4 cm) was dipped into the heated cleaning liquid for 25 seconds.

After being dipped, the test substrate piece was extracted from the cleaning liquid, and the test substrate piece was washed with pure water. After washing with pure water, nitrogen gas was blown onto the substrate surface to remove water and dry the substrate surface.

The dried surface of the test substrate was observed with a scanning electron microscope, and then removability of the resist film by the cleaning liquid was evaluated. A case where the resist film was completely removed was evaluated as A. In addition, a case where the resist film was not completely removed was evaluated as B.

Polyimide Film Removing Test

An Si wafer substrate including a polyimide film having a thickness of approximately 400 nm was used as a test substrate.

The cleaning liquid was heated at 70° C., and then a test substrate piece (2 cm×4 cm) was dipped into the heated cleaning liquid for one minute.

After being dipped, the test substrate piece was extracted from the cleaning liquid, and the test substrate piece was washed with pure water. After washing with pure water, nitrogen gas was blown onto the substrate surface to remove water and dry the substrate surface.

The dried surface of the test substrate was observed with a scanning electron microscope, and then removability of the polyimide film by the cleaning liquid was evaluated. A case where the polyimide film was completely removed was evaluated as A. In addition, a case where the polyimide film was not completely removed was evaluated as B.

Phase Separation Test

Regarding the cleaning liquids in examples and comparative examples, a state immediately after the preparation was visually evaluated for the phase separation.

The cleaning liquids in which the phase separation did not occur were evaluated as A. In addition, the cleaning liquids in which the phase separation occurred were evaluated as B.

TABLE 1

| | | Examples | | | | | | | | | | |
|---|---|---|---|---|---|---|---|---|---|---|---|---|
| | | 1 | 2 | 3 | 4 | 5 | 6 | 7 | 8 | 9 | 10 | 11 |
| Organic Solvent (parts by mass) | MMB | 60 | 49.1 | 49.1 | 55 | 60 | 60 | 50 | 45 | 49 | 49 | 70 |
| | MDG | 19.5 | 15.9 | 0 | 0 | 0 | 19.5 | 0 | 0 | 16 | 0 | 9.5 |
| | MTG | 0 | 0 | 15.9 | 10 | 5 | 0 | 10 | 10 | 0 | 16 | 0 |
| | DPM | 0 | 0 | 0 | 0 | 0 | 0 | 5 | 10 | 0 | 0 | 0 |
| | EDG | 0 | 0 | 0 | 0 | 0 | 0 | 0 | 0 | 0 | 0 | 0 |
| | BDG | 0 | 0 | 0 | 0 | 0 | 0 | 0 | 0 | 0 | 0 | 0 |
| Total content of organic solvents | | 79.5 | 65 | 65 | 65 | 65 | 79.5 | 65 | 65 | 65 | 65 | 79.5 |
| Content % with respect to total content of organic solvents | MMB % | 75% | 76% | 76% | 85% | 92% | 75% | 77% | 69% | 75% | 75% | 88% |
| | MDG % | 25% | 24% | 0% | 0% | 0% | 25% | 0% | 0% | 25% | 0% | 12% |
| | MTG % | 0% | 0% | 24% | 15% | 8% | 0% | 15% | 15% | 0% | 25% | 0% |
| | DPM % | 0% | 0% | 0% | 0% | 0% | 0% | 8% | 15% | 0% | 0% | 0% |
| Component (B) (parts by mass) | TMAH | 5.5 | 5.5 | 5.5 | 5.5 | 5.5 | 5.5 | 5.5 | 5.5 | 5.5 | 5.5 | 5.5 |
| Water (parts by mass) | DIW | 15 | 29.5 | 29.5 | 29.5 | 29.5 | 15 | 29.5 | 29.5 | 29.5 | 29.5 | 15 |
| Remove fluorocarbon layer | | A | A | A | A | A | A | A | A | A | A | A |
| Remove resist | | A | A | A | A | A | A | A | A | A | A | A |
| Remove polyimide layer | | A | A | A | A | A | A | A | A | A | A | B |
| Phase separation | | A | A | A | A | A | A | A | A | A | A | A |

| | | Comparative Examples | | | | | | | | |
|---|---|---|---|---|---|---|---|---|---|---|
| | | 1 | 2 | 3 | 4 | 5 | 6 | 7 | 8 | 9 |
| Organic Solvent (parts by mass) | MMB | 60 | 80 | 0 | 0 | 0 | 0 | 60 | 0 | 60 |
| | MDG | 0 | 0 | 60 | 80 | 0 | 0 | 0 | 0 | 0 |
| | MTG | 0 | 0 | 0 | 0 | 75 | 0 | 0 | 0 | 0 |
| | DPM | 0 | 0 | 0 | 0 | 0 | 0 | 0 | 0 | 0 |
| | EDG | 0 | 0 | 0 | 0 | 0 | 80 | 20 | 0 | 0 |
| | BDG | 0 | 0 | 0 | 0 | 0 | 0 | 0 | 80 | 20 |
| Total content of organic solvents | | 60 | 80 | 60 | 80 | 75 | 80 | 80 | 80 | 80 |
| Content % with respect to total content of organic solvents | MMB % | 100% | 100% | 0% | 0% | 0% | 0% | 75% | 0% | 75% |
| | MDG % | 0% | 0% | 100% | 100% | 0% | 0% | 0% | 0% | 0% |
| | MTG % | 0% | 0% | 0% | 0% | 100% | 0% | 0% | 0% | 0% |
| | DPM % | 0% | 0% | 0% | 0% | 0% | 0% | 0% | 0% | 0% |
| Component (B) (parts by mass) | TMAH | 5.5 | 5.5 | 5.5 | 5.5 | 5.5 | 5.5 | 5.5 | 5.5 | 5.5 |
| Water (parts by mass) | DIW | 34.5 | 14.5 | 34.5 | 14.5 | 19.5 | 14.5 | 14.5 | 14.5 | 14.5 |
| Remove fluorocarbon layer | | — | — | — | — | — | — | — | — | — |
| Remove resist | | B | A | B | B | B | B | B | B | A |
| Remove polyimide layer | | — | — | — | — | — | — | — | — | — |
| Phase separation | | A | B | A | A | A | A | A | A | B |

It is found that the fluorocarbon layer, the resist material, and the polyimide layer can be removed well with the cleaning liquids in Examples 1 to 10. In addition, the phase separation also does not occur in the aforementioned cleaning liquids.

It is found that with the cleaning liquids in the comparative examples which do not contain both of the component (A1) and the component (A2), it is not possible to realize that a crosslinked negative resist is removed, and the phase separation does not occur, at the same time.

Particularly, it is found that in the cleaning liquids in Comparative Examples 2 and 9, the phase separation occurred.

In addition, as apparent from the comparison with Example 11, 3-alkoxy-3-methyl-1-butanol of the component (A1) is preferably contained in an amount of greater than 40% by mass and equal to or less than 65% by mass.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A cleaning liquid comprising:
    (A1) 3-methoxy-3-methyl-1-butanol
    (A2) diethylene glycol monomethyl ether;
    (B) tetramethyl ammonium hydroxide; and
    water,
    wherein the content [a1] of (A1) 3 methoxy-3-methyl-1-butanol is greater than 40% by mass and 65% by mass or less with respect to the mass of the cleaning liquid, and wherein a ratio [a1/(a1+a2)] of the content [a1] of the (A1) 3 methoxy-3-methyl-1-butanol to a total of the content [a1] and the content [a2] of the (A2) diethylene glycol monomethyl ether compound is 65% to 95% by mass.

2. The cleaning liquid according to claim 1, wherein the content [a1] of (A1) 3 methoxy-3-methyl-1-butanol is 45% to 65% by mass with respect to the mass of the cleaning liquid.

3. The cleaning liquid according to claim 1, wherein the content of water is 15% to 40% by mass with respect to the mass of the cleaning liquid.

4. A method of removing at least one target to be removed selected from the group consisting of a resist pattern, a fluorocarbon layer, and a polyimide layer, the method comprising:
removing the target to be removed with the cleaning liquid according to claim 1,
wherein the target to be removed is formed in a semiconductor manufacturing step.

5. A method of etching a substrate, comprising:
(A-I) forming an etching mask pattern on the surface of a substrate;
(A-II) etching the surface of the substrate which is exposed through the etching mask pattern to form a recessed portion;
(A-III) forming a recessed portion having a predetermined depth on the substrate by repeatedly performing the following steps (i) and (ii) until a recessed portion having the predetermined depth is formed:
(i) forming a fluorocarbon layer on a side wall of the recessed portion of the surface of the substrate, which is formed by etching;
(ii) etching a bottom face of the recessed portion; and
(A-IV) removing the fluorocarbon layer with a cleaning liquid after the recessed portion having the predetermined depth is formed,
wherein the cleaning liquid according to claim 1 is used as the cleaning liquid in the fluorocarbon layer removing step.

6. The method of etching a substrate according to claim 5, wherein the etching mask pattern is formed by the following (B-I) to (B-III):
(B-I) applying a resist composition onto the surface of an etching mask layer to form a resist film,
(B-II) exposing and developing the resist film to form a resist pattern, and
(B-III) etching the surface of the etching mask layer exposed through the resist pattern.

7. The method of etching a substrate according to claim 6, further comprising (B-IV) removing the resist pattern with the cleaning liquid according to claim 1.

8. A method of etching a substrate, comprising:
(C-I) forming an etching mask layer on the surface of a substrate;
(C-II) applying a resist composition onto the etching mask layer to form a resist film;
(C-III) exposing and developing the resist film to form a resist pattern;
(C-IV) etching the etching mask layer exposed through an opening portion of the resist pattern to form an etching mask pattern, and then removing the resist pattern with a cleaning liquid;
(C-V) etching the surface of the substrate exposed through the etching mask pattern to form a recessed portion;
(C-VI) forming a recessed portion having a predetermined depth on the substrate by repeatedly performing the following steps (i) and (ii) until a recessed portion having the predetermined depth is formed:
(i) forming a fluorocarbon layer on a side wall of the recessed portion of the surface of the substrate, which is formed by etching;
(ii) etching a bottom face of the recessed portion; and
(C-VII) removing the fluorocarbon layer with a cleaning liquid after the recessed portion having the predetermined depth is formed,
wherein the cleaning liquid according to claim 1 is used as the cleaning liquid in at least one of the etching mask pattern forming step and the fluorocarbon layer removing step.

9. The method of etching a substrate according to claim 8, wherein the cleaning liquid according to claim 1 is used as the cleaning liquid in each of the etching mask pattern forming step and the fluorocarbon layer removing step.

* * * * *